United States Patent

Shin

(10) Patent No.: US 9,209,210 B2
(45) Date of Patent: Dec. 8, 2015

(54) PHOTO-DETECTING PIXEL, PHOTO-DETECTING APPARATUS, AND METHOD OF DRIVING THE PHOTO-DETECTING APPARATUS

(75) Inventor: Chul-Woo Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 768 days.

(21) Appl. No.: 13/401,762

(22) Filed: Feb. 21, 2012

(65) Prior Publication Data

US 2013/0112886 A1    May 9, 2013

(30) Foreign Application Priority Data

Nov. 3, 2011    (KR) .................... 10-2011-0114116

(51) Int. Cl.
*H01L 27/146* (2006.01)
*H04N 5/32* (2006.01)

(52) U.S. Cl.
CPC ...... *H01L 27/14603* (2013.01); *H01L 27/1464* (2013.01); *H01L 27/14614* (2013.01); *H01L 27/14623* (2013.01); *H01L 27/14641* (2013.01); *H01L 27/14689* (2013.01); *H04N 5/32* (2013.01)

(58) Field of Classification Search
USPC .................................................. 250/370.09
See application file for complete search history.

(56) References Cited

U.S. PATENT DOCUMENTS

| | | | |
|---|---|---|---|
| 5,572,074 A | 11/1996 | Standley | |
| 6,532,040 B1 * | 3/2003 | Kozlowski et al. | 348/241 |
| 6,587,142 B1 * | 7/2003 | Kozlowski et al. | 348/241 |
| 6,958,775 B1 | 10/2005 | Shinotsuka et al. | |
| 7,164,443 B1 * | 1/2007 | Hagihara | 348/308 |
| 7,205,568 B2 | 4/2007 | Watanabe et al. | |
| 7,767,974 B2 | 8/2010 | Jung et al. | |
| 7,860,218 B2 | 12/2010 | Inglese et al. | |
| 8,698,089 B2 * | 4/2014 | Jung | 250/370.09 |
| 2008/0111906 A1 * | 5/2008 | Kim et al. | 348/308 |
| 2008/0237448 A1 * | 10/2008 | Simony | 250/208.1 |
| 2010/0289932 A1 * | 11/2010 | Hashimoto | 348/300 |
| 2012/0211660 A1 * | 8/2012 | Allee | 250/362 |

FOREIGN PATENT DOCUMENTS

| | | | |
|---|---|---|---|
| JP | 8-331457 | 12/1996 | |
| JP | 4164590 | 8/2008 | |
| KR | 10-2005-0103294 | 10/2005 | |
| KR | 10-2008-0082643 | 9/2008 | |
| KR | 10-2008-0108642 | 12/2008 | |
| WO | WO2012006355 A2 * | 12/2012 | H04N 5/363 |

* cited by examiner

*Primary Examiner* — Christine Sung
(74) *Attorney, Agent, or Firm* — Christie, Parker & Hale, LLP

(57) ABSTRACT

A photo-detecting apparatus in which the time taken to read out a detection signal is decreased, and thus, a frame rate of the photo-detecting apparatus is improved. A photo-detecting pixel includes a photosensitive device for generating a first detection signal by photoelectrically converting incident light; a first transistor for generating a detection current by receiving the first detection signal generated by the photosensitive device via a gate terminal of the first transistor; a second transistor for forming a first current path with the first transistor, in response to a read signal input via a gate terminal of the second transistor; and a third transistor for delivering a voltage in accordance with the detection current to a data line, in response to a gate signal applied to a gate terminal of the third transistor.

8 Claims, 4 Drawing Sheets

PHOTO-DETECTING PIXEL, PHOTO-DETECTING APPARATUS, AND METHOD OF DRIVING THE PHOTO-DETECTING APPARATUS

CROSS-REFERENCE TO RELATED APPLICATION

This application claims priority to and the benefit of Korean Patent Application No. 10-2011-0114116, filed on Nov. 3, 2011, in the Korean Intellectual Property Office, the disclosure of which is incorporated herein in its entirety by reference.

BACKGROUND

1. Field

The present invention relates to a photo-detecting pixel, a photo-detecting apparatus, and a method of driving the photo-detecting apparatus.

2. Description of Related Art

A photo-detecting apparatus generates a detection signal by detecting incident light, and then generates a captured image from the detection signal. The photo-detecting apparatus is widely used in the field of diagnosis and captures an image of a target object by using various types of radiation rays.

An example of the photo-detecting apparatus is an X-ray detector. An X-ray (or X-radiation) has a short wavelength that can easily pass through a target object, and a transmission amount of the X-ray is decided according to the density inside the target object. That is, an inner state of the target object may be indirectly monitored by referring to the transmission amount of the X-ray that has passed through the target object. The X-ray detector may be used as a medical examination apparatus, a nondestructive examination apparatus, and the like.

The X-ray detector may be formed using a digital radiography method that does not use a film. The X-ray detector may generate a detection signal by detecting the intensity of an X-ray by using a photosensitive device.

SUMMARY

Embodiments of the present invention are directed toward a photo-detecting apparatus in which the time taken to read out a detection signal is decreased, whereby a frame rate of the photo-detecting apparatus is improved.

According to an embodiment of the present invention, there is provided a photo-detecting pixel including a photosensitive device for generating a first detection signal by photoelectrically converting incident light; a first transistor for generating a detection current by receiving the first detection signal generated by the photosensitive device via a gate terminal of the first transistor; a second transistor for forming a first current path with the first transistor, in response to a read signal input via a gate terminal of the second transistor; and a third transistor for delivering a voltage in accordance with the detection current to a data line, in response to a gate signal applied to a gate terminal of the third transistor.

The gate terminal of the first transistor may receive the first detection signal via a first node, and the photo-detecting pixel may further include a fourth transistor having a gate terminal connected to a reset line so as to deliver a reset control signal, a first terminal connected to a reset voltage line, and a second terminal connected to the first node.

The first transistor may have the gate terminal connected to a first node that is connected to a terminal of the photosensitive device, a first terminal connected to a first power, and a second terminal connected to a second node, the second transistor may have the gate terminal connected to a read signal line for delivering the read signal, a first terminal connected to the second node, and a second terminal connected to a second power, and the third transistor may have the gate terminal connected to a gate line for delivering the gate signal, a first terminal connected to the second node, and a second terminal connected to the data line.

The photo-detecting pixel may be included in an X-ray detector.

According to another embodiment of the present invention, there is provided a photo-detecting apparatus including a plurality of photo-detecting pixels; a gate driving unit for generating a reset control signal and a gate signal, and outputting the reset control signal and the gate signal to the plurality of photo-detecting pixels; and a read out unit for reading out a second detection signal from the plurality of photo-detecting pixels via data lines, wherein each of the plurality of photo-detecting pixels includes a photosensitive device for generating a first detection signal by photoelectrically converting incident light; a first transistor for generating a detection current by receiving the first detection signal generated by the photosensitive device via a gate terminal of the first transistor; a second transistor for forming a first current path with the first transistor, in response to a read signal input via a gate terminal of the second transistor; and a third transistor for delivering a detection voltage to a data line as the second detection signal, wherein the detection voltage is formed in accordance with the detection current in response to the gate signal.

The gate terminal of the first transistor may receive the first detection signal via a first node, and each of the photo-detecting pixels may further include a fourth transistor having a gate terminal connected to a reset line so as to deliver a reset control signal, a first terminal connected to a reset voltage line, and a second terminal connected to the first node.

The first transistor may have the gate terminal connected to a first node that is connected to a terminal of the photosensitive device, a first terminal connected to a first power, and a second terminal connected to a second node, the second transistor may have the gate terminal connected to a read signal line for delivering the read signal, a first terminal connected to the second node, and a second terminal connected to a second power, and the third transistor may have a gate terminal connected to a gate line for delivering the gate signal, a first terminal connected to the second node, and a second terminal connected to the data line.

The photo-detecting apparatus may be an X-ray detector.

The first current paths of the plurality of photo-detecting pixels may be concurrently formed.

When the first current path is formed and then is blocked, each of the plurality of photo-detecting pixels may output the second detection signal to the read out unit, in response to the gate signal.

According to another embodiment of the present invention, there is provided a method of driving a photo-detecting apparatus including a plurality of photo-detecting pixels, the method including operations of generating a detection current from a first detection signal generated in a photosensitive device; forming a first current path via which the detection current flows, and thus generating a detection voltage in a second node in accordance with the detection current; and delivering the detection voltage to a data line in response to a gate signal.

The first current path may be concurrently formed in the plurality of photo-detecting pixels.

The operation of delivering the detection voltage may be sequentially performed in row units of the plurality of photo-detecting pixels.

Before the operation of generating the detection current, the method may further include an operation of resetting the photosensitive device.

The photo-detecting apparatus may be an X-ray detector.

The method may further include operations of generating an offset image, and generating an exposure image. The operation of generating the offset image may include operations of generating the detection current, forming the detection voltage, and delivering the detection voltage to a data line, and the operation of generating the exposure image may include operations of exposing the plurality of photo-detecting pixels to an X-ray, generating the detection current, forming the detection voltage, and delivering the detection voltage to a data line.

The operation of generating the offset image may further include an operation of initializing the photosensitive device before the operation of forming the detection current, and the operation of generating the exposure image may further include an operation of initializing the photosensitive device before the operation of exposing the plurality of photo-detecting pixels.

The method may further include an operation of generating a captured image by using the offset image and the exposure image.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The following description and drawings provide a sufficient understanding of the present invention, and functions or constructions that are well-known to one of ordinary skill in the art may be omitted.

The present invention may be embodied in many different forms and should not be construed as being limited to the embodiments set forth herein; rather, the spirit and scope of the present invention are defined by the claims. Also, terms or words used in the following description should be construed as fully satisfying the concept of the invention.

The present invention will now be described more fully with reference to the accompanying drawings, in which exemplary embodiments of the invention are shown.

Figure 1:
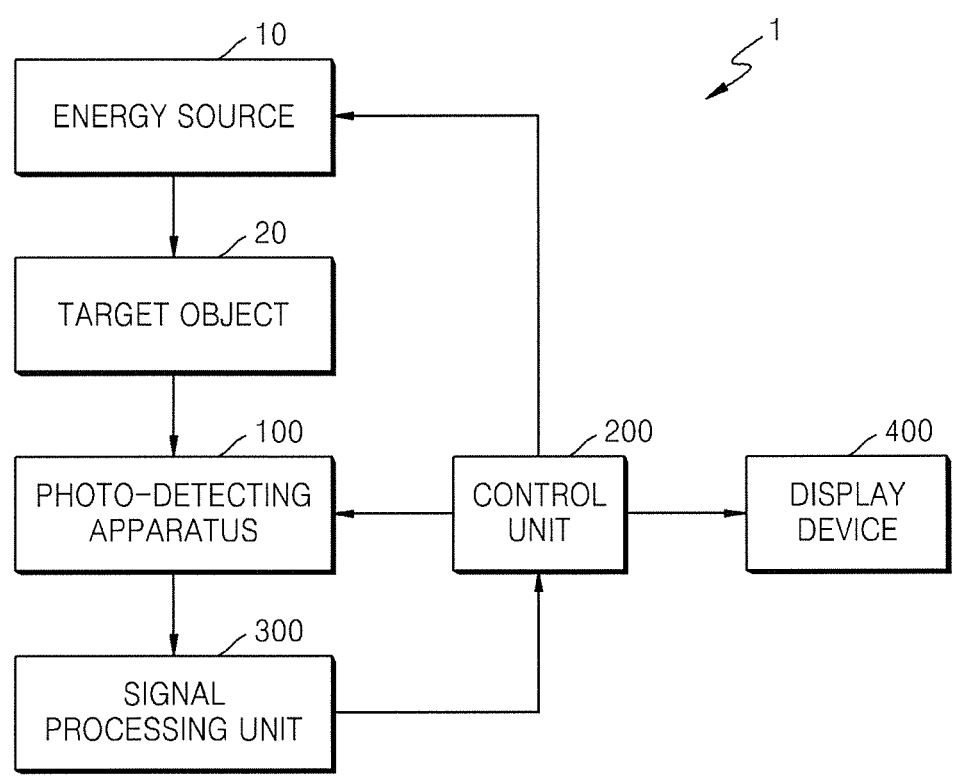
FIG. 1 is a block diagram of a photo-detection system according to an embodiment of the present invention.

FIG. 1 is a block diagram of a photo-detection system 1 according to an embodiment of the present invention.

Referring to FIG. 1, the photo-detection system 1 includes an energy source 10, a photo-detecting apparatus 100, a control unit 200, a signal processor 300, and a display device 400.

The energy source 10 irradiates a radiation ray toward a target object 20. For example, the radiation ray is an X-ray.

The photo-detecting apparatus 100 includes a plurality of photo-detecting pixels in a flat panel to detect the radiation ray. The photo-detecting apparatus 100 includes a plurality of photosensitive devices capable of detecting the transmission amount of a radiation ray that has passed through the target object 20, and switching devices. For example, the photosensitive devices are photo-diodes.

The control unit 200 controls operations of the energy source 10, the photo-detecting apparatus 100, and the display device 400. The control unit 200 may control a radiation-ray irradiation moment (or period) and a radiation-ray irradiation time.

For example, the photo-detecting apparatus 100 may obtain an offset image at a radiation-ray non-irradiation moment, may obtain an exposure image at a radiation-ray irradiation moment, and then may generate an offset-corrected image. To generate the offset-corrected image, the control unit 200 may control driving sequences for enabling the photo-detecting apparatus 100 to obtain the offset image and the exposure image, respectively.

The signal processor 300 converts a detection signal output from the photo-detecting apparatus 100 into a digital signal. The signal processor 300 generates an offset image and an exposure image from the detection signal. For example, the offset image may be updated by averaging a previously-generated offset image and a currently-generated offset image. The signal processor 300 generates the offset-corrected image by subtracting (or removing) an offset image that is generated before the radiation-ray irradiation moment from the exposure image.

The display device 400 displays the offset-corrected image. The display device 400 may include a liquid crystal display (LCD) device, an organic light-emitting display device, a plasma display device, or the like.

Figure 2:
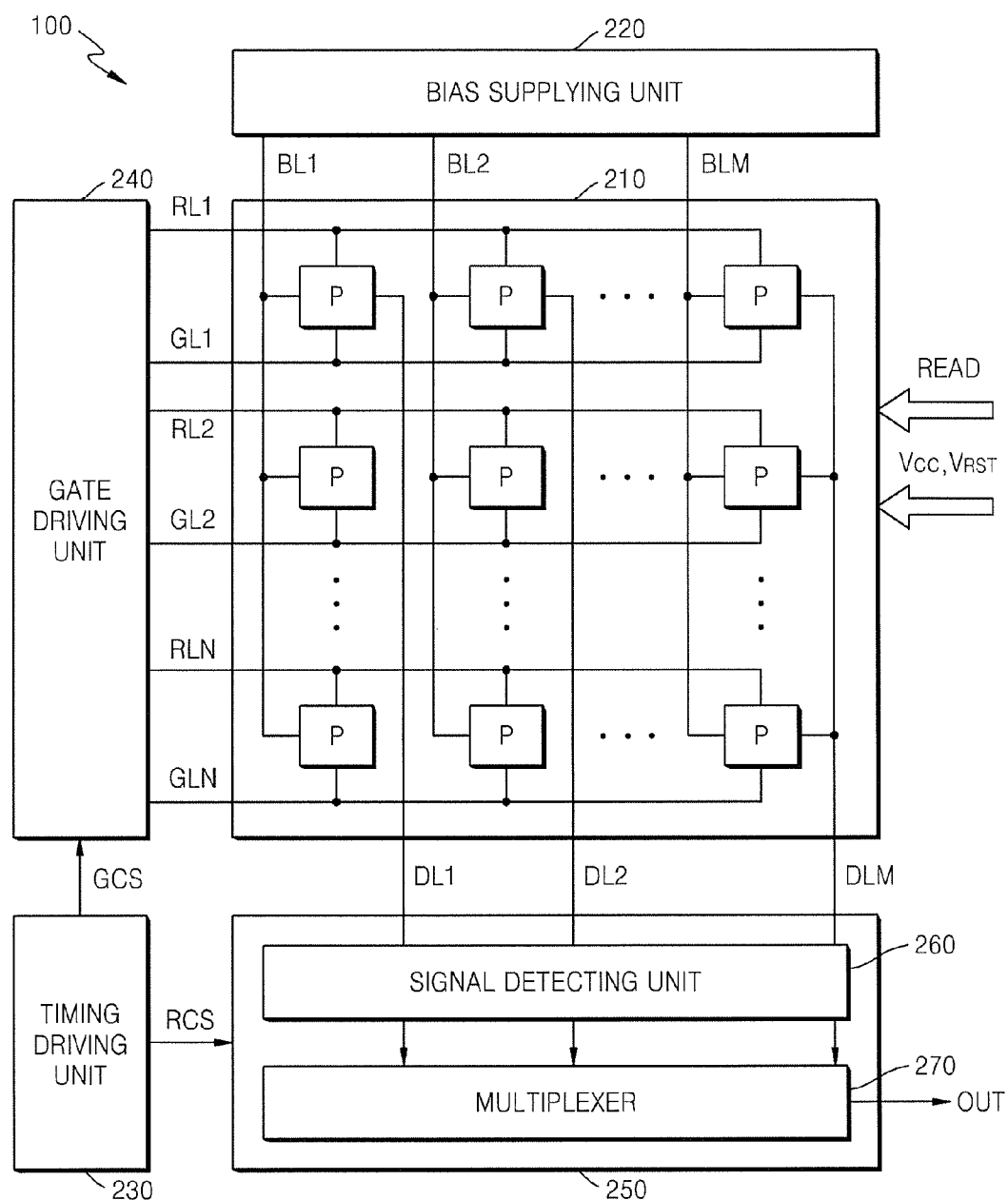
FIG. 2 is a diagram conceptually illustrating a structure of a photo-detecting apparatus, according to an embodiment of the present invention.

FIG. 2 is a diagram illustrating a structure of the photo-detecting apparatus 100, according to an embodiment of the present invention. The photo-detecting apparatus 100 may include a pixel unit 210, a bias supplying unit 220, a timing driving unit 230, a gate driving unit 240, a read out unit 250, a signal detecting unit 260, and a multiplexer 270.

The pixel unit 210 detects radiation rays emitted from the energy source 10, performs photoelectrical conversion on a detected signal, and then outputs an electrical detection signal. The pixel unit 210 includes a plurality of photo-detecting pixels P that are arrayed in a matrix near crossing points of a plurality of gate lines GL1, GL2, . . . , GLN and a plurality of data lines DL1, DL2, . . . , DLM. The gate lines GL1, GL2, . . . , GLN and the data lines DL1, DL2, . . . , DLM may be disposed to closely cross each other.

The photo-detecting pixels P are connected to corresponding reset lines RL1, RL2, . . . , RLN, the gate lines GL1, GL2, . . . , GLN, bias lines BL1, BL2, . . . , BLM, and the data lines DL1, DL2, . . . , DLM, respectively. Also, each of the photo-detecting pixels P may be connected to a lead signal line for delivering a read signal READ, a first power line for delivering a first power Vcc, and a reset voltage line for delivering a reset voltage $V_{RST}$. The read signal READ may be generated by the timing driving unit 230, the gate driving unit 240, or a suitable signal generating unit (not shown), and then may be output to the photo-detecting pixels P. The first power Vcc and reset voltage $V_{RST}$ may be generated by using a set or predetermined power, a direct current/direction current (DC/DC) converter, or the like, and then may be output to the photo-detecting pixels P.

The bias supplying unit 220 delivers a bias voltage via the bias lines BL1, BL2, ..., BLM. The photosensitive device may be a photo-diode, and the photo-diode generates a detection signal corresponding to incident light while a reverse bias is applied thereto. The bias supplying unit 220 generates the bias voltage so as to apply the reverse bias to the photo-diode, and applies the bias voltage to the photosensitive devices arranged in the photo-detecting pixels P. Also, the bias supplying unit 220 may selectively apply the reverse bias or a forward bias to the photo-diode.

The timing driving unit 230 receives a control signal from the control unit 200 (shown in FIG. 1), generates a gate driving signal GCS for controlling the gate driving unit 240, and a read out driving control signal RCS for controlling the read out unit 250, and then outputs the gate driving signal GCS and the read out driving control signal RCS to the gate driving unit 240 and the read out unit 250, respectively. Also, the timing driving unit 230 may output a control signal to the bias supplying unit 220.

The gate driving unit 240 generates a gate signal and a reset signal. The gate signal is output to the plurality of photo-detecting pixels P via the gate lines GL1, GL2, ..., GLN, and the reset signal is output to the plurality of photo-detecting pixels P via the reset lines RL1, RL2, ..., RLN.

The reset signal allows a reset voltage $V_{RST}$ to be applied to a photosensitive device so as to initialize the photosensitive device. In one embodiment, the reset signal may have a gate-on level so as to allow the reset voltage $V_{RST}$ to be applied to the photosensitive device in an early stage of an offset image read out period or an exposure image read out period. Here, the gate-on level is a voltage level at which a corresponding transistor is turned on when a corresponding signal is applied to a gate terminal. Also, the reset signal may have sequential gate-on levels with respect to the reset lines RL1, RL2, ..., RLN in the early stage of the offset image read out period or the exposure image read out period.

The gate signal allows a detection signal to be output from the plurality of photo-detecting pixels P to the data lines DL1, DL2, ..., DLM. In one embodiment, when the detection signal is read out, the gate signal may have sequential gate-on levels with respect to the gate lines GL1, GL2, ..., GLN.

The read out unit 250 reads out the detection signal output from the plurality of photo-detecting pixels P. The plurality of photo-detecting pixels P output the detection signal to the read out unit 250 via the data lines DL1, DL2, ..., DLM. The read out unit 250 may read out an offset image or an exposure image. According to the present embodiment, the read out unit 250 may include the signal detecting unit 260 and the multiplexer 270.

The signal detecting unit 260 includes a plurality of amplifying units that correspond to the data lines DL1, DL2, ..., DLM, respectively.

Figure 3:
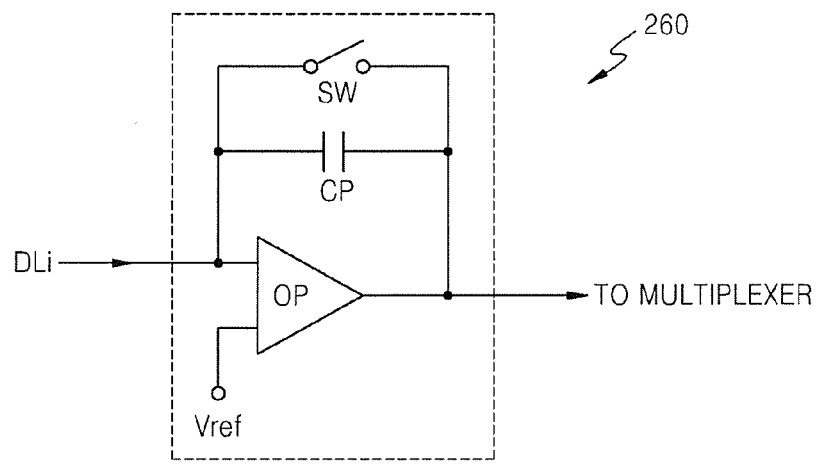
FIG. 3 is a circuit diagram of an amplifying unit included in a signal detecting unit, according to an embodiment of the present invention.

FIG. 3 is a circuit diagram of an amplifying unit included in the signal detecting unit 260, according to an embodiment of the present invention.

In FIG. 3, the amplifying unit includes an amplifier OP, a capacitor CP, and a reset device SW.

The amplifier OP has a first input terminal that is connected to a corresponding data line from among the data lines DL1, DL2, ..., DLM, a second input terminal that receives a reference voltage Vref, and an output terminal. The reference voltage Vref may be a ground voltage. The first input terminal may be an inverting input of the amplifier OP, and the second input terminal may be a non-inverting input of the amplifier OP. A signal output from the output terminal of the amplifier OP is input to the multiplexer 270.

A terminal of the capacitor CP is electrically connected to the first input terminal of the amplifier OP, and the other terminal of the capacitor CP is electrically connected to the output terminal of the amplifier OP.

The reset device SW (e.g., a switch) resets the capacitor CP by discharging a voltage charged in the capacitor CP. The reset device SW is connected to the capacitor CP in parallel. A terminal of the reset device SW is electrically connected to one terminal of the capacitor CP, and the other terminal of the reset device SW is electrically connected to the other terminal of the capacitor CP. The reset device SW may be a switch capable of electrically connecting both terminals of the capacitor CP. When the switch is closed, both terminals of the capacitor CP are electrically connected, and a voltage charged between the terminals of the capacitor CP is discharged. The reset device SW, e.g., the switch, is closed during a gate scan mode, thereby discharging the data lines DL1, DL2, ..., DLM.

The multiplexer 270 (refer to FIG. 2) receives detection signals amplified by the amplifiers OP of the signal detecting unit 260 and sequentially outputs the detection signals to the signal processor 300. The multiplexer 270 may include switches corresponding to the amplifiers OP, respectively.

Figure 4:
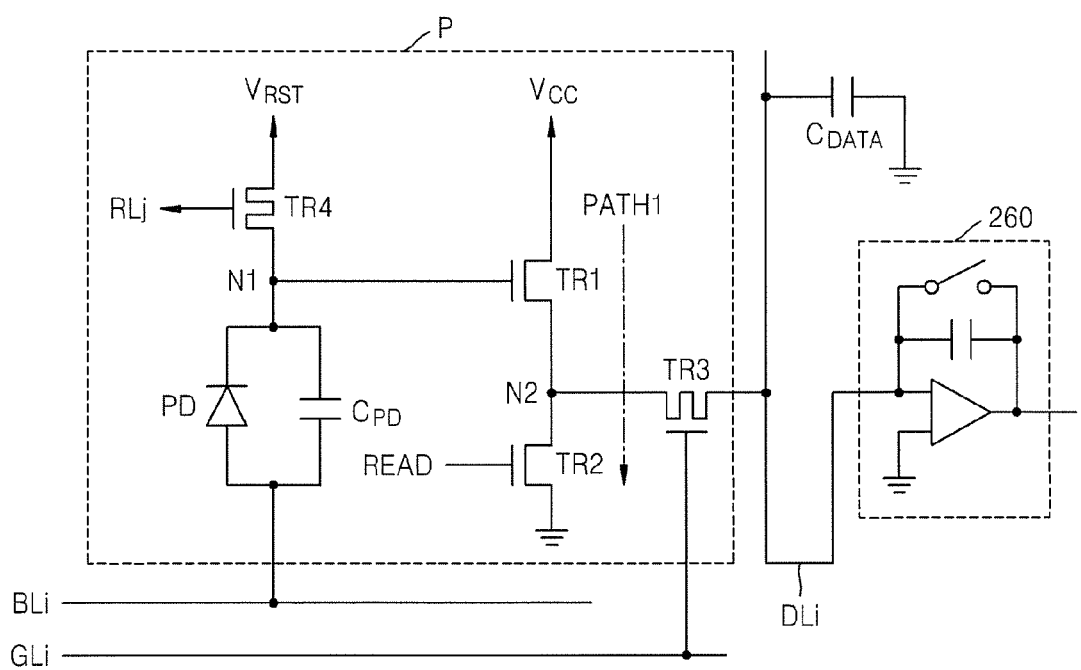
FIG. 4 is a circuit diagram of a photo-detecting pixel, according to an embodiment of the present invention.

FIG. 4 is a circuit diagram of a photo-detecting pixel P, according to an embodiment of the present invention. FIG. 4 illustrates the photo-detecting pixel P at a j column and a j row.

The photo-detecting pixel P may include a photosensitive device PD, a first transistor TR1, a second transistor TR2, a third transistor TR3, and a fourth transistor TR4.

The photosensitive device PD generates an electrical signal as a first detection signal by photoelectrically converting incident light. In the present embodiment, the photosensitive device PD is a photo-diode. The photosensitive device PD may have a structure in which a cathode is connected to a first node N1 and an anode is connected to a bias line BLj. In FIG. 4, a capacitor symbol $C_{PD}$ represents capacitance that exists in the photosensitive device PD, and it is not a case in which a discrete or separate capacitor $C_{PD}$ connected with the photosensitive device PD in parallel is included in the photosensitive device PD.

According to the present embodiment, the photosensitive device PD may be a PIN diode that generates an electrical detection signal by detecting an X-ray. Also, the photosensitive device PD may include a scintillator and convert an incident X-ray into green light having a wavelength of about 500 nm in a visible ray region, so that the photosensitive device PD may photoelectrically convert the green light and then may generate the first detection signal. The scintillator may be formed of a cesium iodide compound.

The first transistor TR1 has a gate terminal connected to the first node N1, a first terminal connected to a first power line for delivering a first power Vcc, and a second terminal connected to a second node N2. The first transistor TR1 generates a detection current by amplifying the first detection signal input via the first node N1.

The second transistor TR2 has a gate terminal connected to a read signal line for delivering a read signal READ, a first terminal connected to the second node N2, and a second terminal connected to a second power. The second power may not be a separate power source but may be a ground line. When the read signal READ has a gate-on level, the second transistor TR2 is turned on to form a first current path PATH1 through the first transistor TR1 and the second transistor TR2.

When the first current path PATH1 is formed, the second node N2 has a detection voltage level that is determined by the detection current generated by the first transistor TR1. That is, the second node N2 has the detection voltage level that is determined by a first detection signal level of the first node N1.

The third transistor TR3 has a gate terminal connected to a gate line GLj, a first terminal connected to the second node N2, and a second terminal connected to a data line DLj. The third transistor TR3 is turned on when a gate signal applied via the gate line GLj has a gate-on level, and then delivers a detection voltage level of the second node N2 to the data line DLj as a second detection signal.

The fourth transistor TR4 has a gate terminal connected to a reset line RLj for delivering a reset signal, a first terminal connected to a reset voltage line for delivering a reset voltage $V_{RST}$, and a second terminal connected to the first node N1. The fourth transistor TR4 is turned on when the reset signal has a gate-on level, so that the fourth transistor TR4 applies the reset voltage $V_{RST}$ to the first node N1 and then initializes voltage levels of the first node N1 and the photosensitive device PD. The reset signal may have the gate-on level before an offset image is read out or is exposed to generate an exposure image.

The data lines DL1, DL2, ..., DLM are connected to the amplifying units included in the signal detecting unit 260, and the second detection signals delivered via the data lines DL1, DL2, ..., DLM are input to the signal detecting unit 260.

Figure 5:
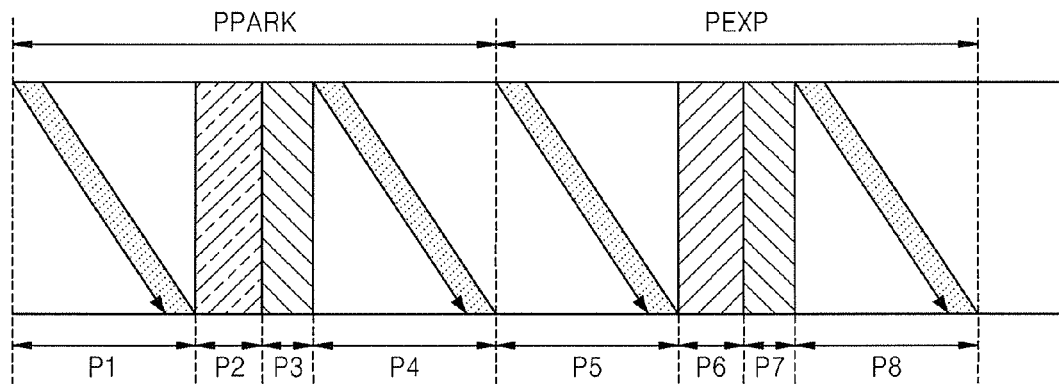
FIG. 5 illustrates a method of driving a photo-detecting apparatus, according to an embodiment of the present invention.
Figure 6:
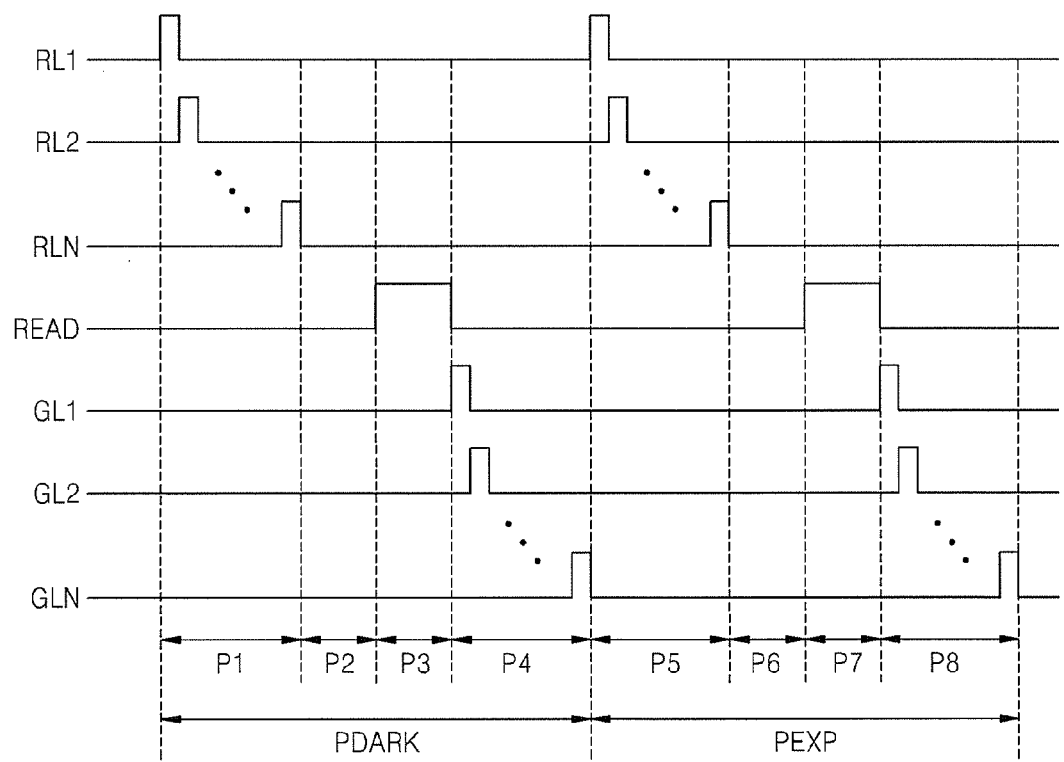
FIG. 6 is a timing diagram of driving signals, according to an embodiment of the present invention.

FIG. 5 illustrates a method of driving a photo-detecting apparatus, according to an embodiment of the present invention. FIG. 6 is a timing diagram of driving signals, according to an embodiment of the present invention. The method of driving a photo-detecting apparatus will now be described with reference to FIGS. 4 through 6.

The method of driving a photo-detecting apparatus includes an offset image generation period PDARK and an exposure image generation period PEXP.

The offset image generation period PDARK is a period in which an offset image that is generated after initialization and that the photo-detecting pixels P are not exposed yet, is detected. The offset image generation period PDARK includes a first reset period P1, an offset window period P2, a first detection voltage delivery period P3, and a first read out period P4.

During the first reset period P1, reset pulses having a gate-on level are sequentially applied to the reset lines RL1, RL2, ..., RLN. Accordingly, the fourth transistor TR4 is turned on, so that the reset voltage $V_{RST}$ is applied to the first node N1, and the plurality of photo-detecting pixels P are initialized.

In another embodiment, during the first reset period P1, reset pulses may be concurrently (e.g., simultaneously) applied to the reset lines RL1, RL2, ..., RLN. In another embodiment, during the first reset period P1, gate pulses may be applied to the reset lines RL1, RL2, ..., RLN while the gate pulses overlap with each other.

Next, during the offset window period P2, a turn-off time of the first through fourth transistors TR1 through TR4 is maintained for a set or predetermined time. The offset window period P2 may have the same duration as an exposure period P6 in the image generation period PEXP. In another embodiment, the offset window period P2 may be omitted.

Next, in the first detection voltage delivery period P3, a read control signal READ having a gate-on level is applied to the gate terminal of the second transistor TR2 of each photo-detecting pixel P. Here, the read control signal READ may be commonly applied to the plurality of photo-detecting pixels P.

By doing so, the first current path PATH1 through the first transistor TR1 and the second transistor TR2 is formed. When the first current path PATH1 is formed, a detection current that is generated by the first transistor TR1 according to a voltage level of the first node N1 which is determined according to a first detection signal flows via the first current path PATH1, and the second node N2 has a detection voltage level.

Next, in the first read out period P4, gate pulses having a gate-on level are sequentially applied to the gate lines GL1, GL2, ..., GLN, so that the detection voltage level of the second node N2 is read out as a second detection signal. The second detection signal is input to the read out unit 250 via the data lines DL1, DL2, ..., DLM. In each of the plurality of photo-detecting pixels P, the third transistor TR3 is turned on in response to the gate pulse, and the detection voltage level of the second node N2 is delivered to the data line DLj via the third transistor TR3.

The exposure image generation period PEXP is a period in which an exposure image obtained by exposing the photo-detecting apparatus 100 is detected. The exposure image generation period PEXP includes a second reset period P5, the exposure period P6, a second detection voltage delivery period P7, and a second read out period P8.

During the second reset period P5, a gate-on level is sequentially applied to the reset lines RL1, RL2, ..., RLN. Accordingly, the fourth transistor TR4 is turned on, so that the reset voltage $V_{RST}$ is applied to the first node N1, and each photo-detecting pixel P is initialized.

As described above with respect to the first reset period P1, during the second reset period P5, reset pulses may be concurrently (e.g., simultaneously) applied to the reset lines RL1, RL2, ..., RLN, or gate pulses may be applied to the reset lines RL1, RL2, ..., RLN while the gate pulses overlap with each other.

Next, during the exposure period P6, when the first through fourth transistors TR1 through TR4 are turned off, a radiation ray generated in the energy source 10 is irradiated to the photo-detecting apparatus 100. During the exposure period P6, each photosensitive device PD photoelectrically converts the incident radiation ray and thus generates a first detection signal corresponding to the intensity of the radiation ray that has passed through the target object 20. The voltage level of the first node N1 is determined by the first detection signal.

Next, during the second detection voltage delivery period P7, the read control signal READ having a gate-on level is applied to the gate terminal of the second transistor TR2 of each photo-detecting pixel P. Here, the read control signal READ may be commonly applied to the plurality of photo-detecting pixels P. By doing so, the first current path PATH1 through the first transistor TR1 and the second transistor TR2 is formed. When the first current path PATH1 is formed, the detection current that is generated by the first transistor TR1 according to the voltage level of the first node N1 which is determined according to the first detection signal flows via the first current path PATH1, and the second node N2 has the detection voltage level.

Next, in the second read out period P8, gate pulses having a gate-on level are sequentially applied to the gate lines GL1, GL2, ..., GLN, so that the detection voltage level of the second node N2 is read out as a second detection signal. The second detection signal is input to the read out unit 250 via the data lines DL1, DL2, ..., DLM. In each of the plurality of photo-detecting pixels P, the third transistor TR3 is turned on in response to the gate pulse, and the detection voltage level of the second node N2 is delivered to the data line DLj via the third transistor TR3.

According to the one or more embodiments of the present invention, before the read out unit 250 (refer to FIG. 2) performs a read out operation, the plurality of photo-detecting pixels P previously and sequentially deliver a detection voltage level to the second node N2 during the first detection voltage delivery period P3 and the second detection voltage delivery period P7, so that a read out time may be significantly decreased. This decrease is possible because each of the plurality of photo-detecting pixels P has the second transistor TR2 that functions as a current source. By doing so, a frame rate of the photo-detecting apparatus 100 may be considerably increased. Also, according to the increase of the frame rate, the photo-detecting apparatus 100 may drive a moving picture and perform sequential photographing.

When the structure of the photo-detecting pixel P shown in FIG. 4 is actually used, a frame rate of 9.6 frames/second may be obtained according to one embodiment.

The signal processor 300 generates a captured image by using the offset image and the exposure image. The captured image may be obtained by subtracting or removing the offset image from the exposure image.

According to the one or more embodiments of the present invention, the time taken to read out a detection signal is decreased in the photo-detecting apparatus, whereby a frame rate of the photo-detecting apparatus may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A photo-detecting pixel comprising:
a photosensitive device for generating a first detection signal by photoelectrically converting incident light;
a first transistor for generating a detection current by receiving the first detection signal generated by the photosensitive device via a gate terminal of the first transistor;
a second transistor for forming a first current path with the first transistor, in response to a read signal input via a gate terminal of the second transistor; and
a third transistor for delivering a voltage in accordance with the detection current to a data line, in response to a gate signal applied to a gate terminal of the third transistor,
wherein the first transistor has the gate terminal connected to a first node that is connected to a terminal of the photosensitive device, a first terminal connected to a first power, and a second terminal connected to a second node,
the second transistor has the gate terminal connected to a read signal line for delivering the read signal, a first terminal connected to the second node, and a second terminal connected to a second power, and
the third transistor has the gate terminal connected to a gate line for delivering the gate signal, a first terminal connected to the second node, and a second terminal connected to the data line.

2. The photo-detecting pixel of claim 1, wherein the gate terminal of the first transistor receives the first detection signal via a first node, and
the photo-detecting pixel further comprises a fourth transistor having a gate terminal connected to a reset line so as to deliver a reset control signal, a first terminal connected to a reset voltage line, and a second terminal connected to the first node.

3. The photo-detecting pixel of claim 1, wherein the photo-detecting pixel is included in an X-ray detector.

4. A photo-detecting apparatus comprising:
a plurality of photo-detecting pixels;
a gate driving unit for generating a reset control signal and a gate signal, and outputting the reset control signal and the gate signal to the plurality of photo-detecting pixels; and
a read out unit for reading out a second detection signal from the plurality of photo-detecting pixels via data lines,
wherein each of the plurality of photo-detecting pixels comprises:
a photosensitive device for generating a first detection signal by photoelectrically converting incident light;
a first transistor for generating a detection current by receiving the first detection signal generated by the photosensitive device via a gate terminal of the first transistor;
a second transistor for forming a first current path with the first transistor, in response to a read signal input via a gate terminal of the second transistor; and
a third transistor for delivering a detection voltage to a data line as the second detection signal, wherein the detection voltage is formed in accordance with the detection current in response to the gate signal,
wherein the first transistor has the gate terminal connected to a first node that is connected to a terminal of the photosensitive device, a first terminal connected to a first power, and a second terminal connected to a second node,
the second transistor has the gate terminal connected to a read signal line for delivering the read signal, a first terminal connected to the second node, and a second terminal connected to a second power, and
the third transistor has a gate terminal connected to a gate line for delivering the gate signal, a first terminal connected to the second node, and a second terminal connected to the data line.

5. The photo-detecting apparatus of claim 4, wherein the gate terminal of the first transistor receives the first detection signal via a first node, and
each of the photo-detecting pixels further comprises a fourth transistor having a gate terminal connected to a reset line so as to deliver a reset control signal, a first terminal connected to a reset voltage line, and a second terminal connected to the first node.

6. The photo-detecting apparatus of claim 4, wherein the photo-detecting apparatus is an X-ray detector.

7. The photo-detecting apparatus of claim 4, wherein the first current paths of the plurality of photo-detecting pixels are concurrently formed.

8. The photo-detecting apparatus of claim 7, wherein, when the first current path is formed and then is blocked, each of the plurality of photo-detecting pixels outputs the second detection signal to the read out unit, in response to the gate signal.

* * * * *